US010046973B2

(12) United States Patent
Jung et al.

(10) Patent No.: US 10,046,973 B2
(45) Date of Patent: Aug. 14, 2018

(54) APPARATUS AND METHOD FOR MANUFACTURING SIO

(71) Applicant: LG Chem, Ltd., Seoul (KR)

(72) Inventors: Sang-Yun Jung, Daejeon (KR); Han-Nah Jeong, Daejeon (KR); Cheol-Hee Park, Daejeon (KR); Chee-Sung Park, Daejeon (KR); Jae-Hyun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 50 days.

(21) Appl. No.: 14/587,848

(22) Filed: Dec. 31, 2014

(65) Prior Publication Data
US 2015/0110699 A1    Apr. 23, 2015

Related U.S. Application Data

(63) Continuation of application No. PCT/KR2014/004410, filed on May 16, 2014.

(30) Foreign Application Priority Data

May 16, 2013   (KR) .......................... 10-2013-0055884
May 16, 2013   (KR) .......................... 10-2013-0055894

(51) Int. Cl.
*C23C 14/24*        (2006.01)
*C23C 14/56*        (2006.01)
(Continued)

(52) U.S. Cl.
CPC ............. *C01B 33/113* (2013.01); *B01J 19/18* (2013.01); *C01B 33/182* (2013.01); *C23C 14/24* (2013.01);
(Continued)

(58) Field of Classification Search
None
See application file for complete search history.

(56) References Cited

U.S. PATENT DOCUMENTS 3,854,442 A * 12/1974 Adam ................... C23C 14/562
                                                  118/718
5,374,382 A * 12/1994 Nishiwaki ........... C09B 67/0097
                                                  118/100

(Continued)

FOREIGN PATENT DOCUMENTS

JP    62-056320 A    3/1987
JP    03-008437 A    1/1991
(Continued)

Primary Examiner — Karla A Moore
(74) Attorney, Agent, or Firm — Dentons US LLP

(57) ABSTRACT

Disclosed is an apparatus and method for manufacturing SiO, which may lower a manufacturing cost of SiO by collecting SiO continuously. The apparatus for manufacturing SiO includes a reaction unit configured to receive a SiO-making material and bring the received material into reaction by heating to generate a SiO gas; and a collecting unit configured to maintain an internal temperature lower than an internal temperature of the reaction unit, the collecting unit including a rotating member in an inner space thereof, wherein the collecting unit collects a SiO deposit by introducing the SiO gas generated by the reaction unit through an inlet formed at least at one side thereof and allowing the introduced SiO gas to be deposited to a surface of the rotating member.

8 Claims, 10 Drawing Sheets

(51) Int. Cl.
  *C23C 14/58* (2006.01)
  *C01B 33/113* (2006.01)
  *B01J 19/18* (2006.01)
  *C01B 33/18* (2006.01)
(52) U.S. Cl.
  CPC ............ *C23C 14/56* (2013.01); *C23C 14/562* (2013.01); *C23C 14/588* (2013.01); *C23C 14/5873* (2013.01)

(56) References Cited

U.S. PATENT DOCUMENTS

| | | | | |
|---|---|---|---|---|
| 5,449,063 | A | * | 9/1995 | Thomas, Sr. ......... B65G 23/06 198/494 |
| 2001/0012503 | A1 | * | 8/2001 | Fukuoka ............... C01B 33/113 423/335 |
| 2003/0161955 | A1 | * | 8/2003 | Brumwell ................ G03C 1/74 427/348 |
| 2005/0161678 | A1 | | 7/2005 | Weinert et al. |

FOREIGN PATENT DOCUMENTS

| | | |
|---|---|---|
| JP | 2852762 B2 | 2/1999 |
| JP | 2911520 B2 | 6/1999 |
| JP | 2001-220123 A | 8/2001 |
| JP | 2003-119017 A | 4/2003 |
| JP | 2005225690 A | 8/2005 |
| JP | 2011-255291 A | 12/2011 |
| JP | 2005-517620 A | 6/2012 |
| WO | 95/29124 A1 | 11/1995 |
| WO | 2006/010720 A2 | 2/2006 |

* cited by examiner

APPARATUS AND METHOD FOR MANUFACTURING SIO

CROSS-REFERENCE TO RELATED APPLICATION

The present application is a continuation of International Application No. PCT/KR2014/004410 filed on May 16, 2014, which claims priority under 35 USC 119(a) to Korean Patent Application Nos. 10-2013-0055884 and 10-2013-0055894 filed on May 16, 2013 in the Republic of Korea, the disclosures of which are incorporated herein by reference.

TECHNICAL FIELD

The present disclosure relates to an apparatus and method for manufacturing silicon oxide (SiO), and more particularly, to an apparatus and method for manufacturing SiO, which may lower a manufacturing cost of SiO by collecting SiO continuously.

BACKGROUND ART

Generally, a secondary battery refers to a rechargeable battery, while a primary battery refers to a non-rechargeable battery. Secondary batteries are widely used for electronic devices such as cellular phones, notebook computers, video cameras, electric vehicles, or the like. In particular, a lithium secondary battery recently has a higher capacity in comparison to nickel-cadmium batteries or nickel hydrogen batteries and a high energy density per unit weight. For this reason, lithium secondary batteries are being utilized more and more.

The lithium secondary battery includes an electrode assembly in which a cathode plate coated with a cathode active material and an anode plate coated with an anode active material are disposed with a separator interposed between them, and the electrode assembly is contained and sealed in an exterior material together with an electrolyte.

The cathode active material generally employs lithium metal oxides such as $LiMn_2O_4$ or $LiCoO_2$, and the anode active material generally employs a carbon material.

In particular, in case of the anode active material, a lithium metal was used in an early stage, but since lithium has low reversibility and low safety, a carbon material is widely used at present. The carbon material has a small volume change, excellent reversibility and good price, though its capacity is small in comparison to a lithium metal.

However, as lithium secondary batteries are used more and more, high-capacity lithium secondary batteries are demanded more and more, and accordingly a high-capacity anode active material capable of substituting a small-capacity carbon material is also demanded. To meet such demands, there are many attempts to use a metal such as Si and Sn, which exhibits a high charging/discharging capacity in comparison to a carbon material and allows electrochemical alloying, as the anode active material.

However, the metallic anode active material is easily cracked or made into powder due to its serious change of volume accompanied with charging or discharging, and thus a secondary battery using such a metallic anode active material suffers from a rapidly deteriorated capacity according to charging/discharging cycles and a short cycle span.

Therefore, to prevent such problems, there have been recently made many endeavors to use a metal oxide such as SiO as the anode active material. In particular, SiO may be used as the anode active material solely or together with another material such as a carbon material.

However, in order to utilize SiO as the anode active material, several problems should be solved. Representatively, a manufacturing cost should be lowered by shortening a manufacturing time of SiO and allowing mass production. However, SiO manufacturing techniques proposed until now have a limit in mass-producing SiO. Therefore, there is needed to develop a new SiO manufacturing technique.

DISCLOSURE

Technical Problem

The present disclosure is designed to solve the problems of the related art, and therefore the present disclosure is directed to providing an apparatus and method for manufacturing SiO, which may effectively lower a SiO manufacturing cost by allowing SiO to be continuously manufactured.

Other objects and advantages of the present disclosure will be understood from the following descriptions and become apparent by the embodiments of the present disclosure. In addition, it is understood that the objects and advantages of the present disclosure may be implemented by components defined in the appended claims or their combinations.

Technical Solution

In one aspect of the present disclosure, there is provided an apparatus for manufacturing SiO, which includes a reaction unit configured to receive a SiO-making material and bring the received material into reaction by heating to generate a SiO gas; and a collecting unit configured to maintain an internal temperature lower than an internal temperature of the reaction unit, the collecting unit including a rotating member in an inner space thereof, wherein the collecting unit collects a SiO deposit by introducing the SiO gas generated by the reaction unit through an inlet formed at least at one side thereof and allowing the introduced SiO gas to be deposited to a surface of the rotating member.

Preferably, the rotating member may include a rotating body which rotates based on a central axis, and the gas introduced through the inlet may be deposited to a surface of the rotating body.

Also preferably, the rotating body may have a cylindrical shape and rotate in a circumferential direction.

Also preferably, the rotating member may include a belt and at least one wheel, and the gas introduced through the inlet may be deposited to a surface of the belt.

Preferably, the collecting unit may rotate the wheel to move the belt while the SiO gas is being introduced.

Also preferably, at least one of the wheels may have a circular shape in a front form thereof.

Also preferably, at least one of the wheels may have a polygonal shape in a front form thereof.

Also preferably, at least one of the wheels may have unevenness on a surface thereof which is in contact with the belt.

More preferably, the unevenness may be formed in a rotating direction of the wheel.

Also preferably, the wheel may include three or more the rotating member, and the belt may have three or more bent portions.

More preferably, the inlet may be formed in an upper portion of the collecting unit, and the rotating member may be formed so that a length direction of an upper portion of the belt is a horizontal direction.

Also preferably, the collecting unit may further include a removing member for separating the SiO deposit from the surface of the rotating member.

Also preferably, the removing member may be configured to have a plate form so that at least one edge thereof contacts the surface of the rotating member.

Also preferably, the removing member may be inclined so that an end thereof contacting the surface of the rotating member is higher than an end opposite thereto.

Also preferably, the removing member may inject a gas to the surface of the rotating member.

Also preferably, the collecting unit may control the internal temperature by means of the gas injected by the removing member.

Also preferably, the collecting unit may cool the surface of the rotating member by means of the gas injected by the removing member.

Also preferably, the removing member may vibrate the rotating member so that the SiO deposit is easily separated from the surface of the rotating member.

Also preferably, the collecting unit may maintain the internal temperature in a range of 200° C. to 500° C.

Also preferably, the collecting unit may maintain the inner space in a decompressed state.

Also preferably, at least a part of the rotating member may be located at the inlet.

Also preferably, the collecting unit may include a guide tube for guiding the SiO gas introduced through the inlet to the rotating member.

Also preferably, the apparatus for manufacturing SiO according to the present disclosure may further include a supplying unit configured to store a SiO-making material and automatically supply the SiO-making material to the reaction unit.

Also preferably, the reaction unit may heat the supplied material to a temperature of 1200° C. to 1500° C.

In another aspect of the present disclosure, there is also provided a method for manufacturing SiO, which includes supplying a SiO-making material to a reaction unit; bring the received material into reaction in the reaction unit by heating to generate a SiO gas; introducing the generated SiO gas to a collecting unit which maintains an internal temperature lower than an internal temperature of the reaction unit and includes a rotating member; allowing the SiO gas to be deposited to a surface of the rotating member to form a SiO deposit; and collecting the formed SiO deposit.

Preferably, the rotating member may include a rotating body which rotates based on a central axis, and in the SiO deposit forming step, the gas introduced through the inlet may be deposited to a surface of the rotating body.

Also preferably, the rotating body may have a cylindrical shape and rotate in a circumferential direction.

Also preferably, the rotating member may include a belt and at least one wheel, and in the SiO deposit forming step, the SiO gas may be deposited to a surface of the belt.

Also preferably, the SiO gas introducing step may be performed according to a rotation of the wheel while the belt is moving.

Also preferably, the collecting step may include a component for separating the SiO deposit from the surface of the rotating member.

Also preferably, the SiO deposit may be separated by bringing at least one edge of the removing member having a plate form into contact with the surface of the rotating member.

Also preferably, the SiO deposit may be separated by injecting a gas to the surface of the rotating member.

Also preferably, the SiO deposit may be separated by vibrating the rotating member.

Also preferably, the SiO deposit forming step may be performed under a temperature condition of 200° C. to 500° C.

Also preferably, the SiO deposit forming step may be performed under a decompressed state.

Also preferably, in the SiO gas generating step, the supplied material is heated to a temperature of 1200° C. to 1500° C. and brought into reaction to generate a SiO gas.

Advantageous Effects

According to the present disclosure, SiO may be continuously manufactured since a SiO gas is solidified while being deposited to a surface of a rotating member and SiO may be collected in this process.

Therefore, according to the present disclosure, it is possible to shorten a SiO manufacturing time, reduce a SiO manufacturing cost and allow mass production of SiO. Therefore, since a unit price of SiO is lowered and SiO may be sufficiently supplied, SiO may be stably used in many fields. In particular, SiO may be used as an anode active material of a secondary battery or the like, and in this case, it is possible to reduce a manufacturing time and cost of the secondary battery.

In addition, in an aspect of the present disclosure, SiO may be easily separated from the surface of the rotating body by means of a removing member. Therefore, a SiO manufacturing speed may be improved.

Further, in this aspect, the removing member may separate SiO from the surface of the rotating body in a fixed location. Therefore, in this case, it is possible to prevent the apparatus or process from being complicated due to any component for moving the removing member, and SiO may be separated and collected rapidly.

In addition, in an aspect of the present disclosure, since a tension is applied to a belt at a portion where the belt is bent by a wheel, SiO adhered to the belt may be easily separated.

Moreover, if the removing member is further provided, SiO may be more easily separated from the surface of the belt conveyor. Therefore, in this embodiment, a SiO manufacturing speed may be improved.

Further, in this embodiment, the the removing member may separate SiO from the surface of the belt conveyor in a fixed location. Therefore, in this case, it is possible to prevent the apparatus or process from being complicated due to any component for moving the belt conveyor, and SiO may be separated and collected rapidly.

DESCRIPTION OF DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
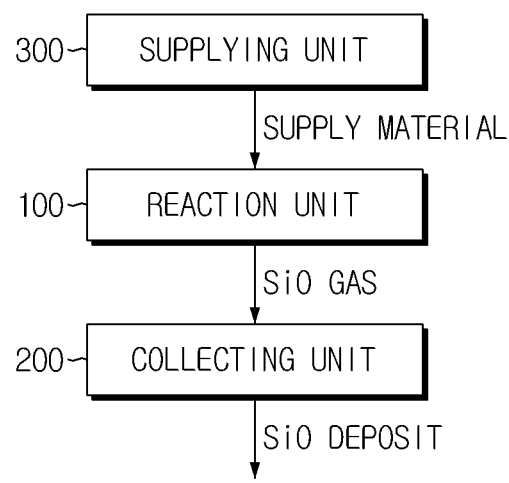
FIG. 1 is a block diagram schematically showing a functional configuration of an apparatus for manufacturing SiO according to an embodiment of the present disclosure.

FIG. 1 is a block diagram schematically showing a functional configuration of an apparatus for manufacturing SiO according to an embodiment of the present disclosure.

Figure 2:
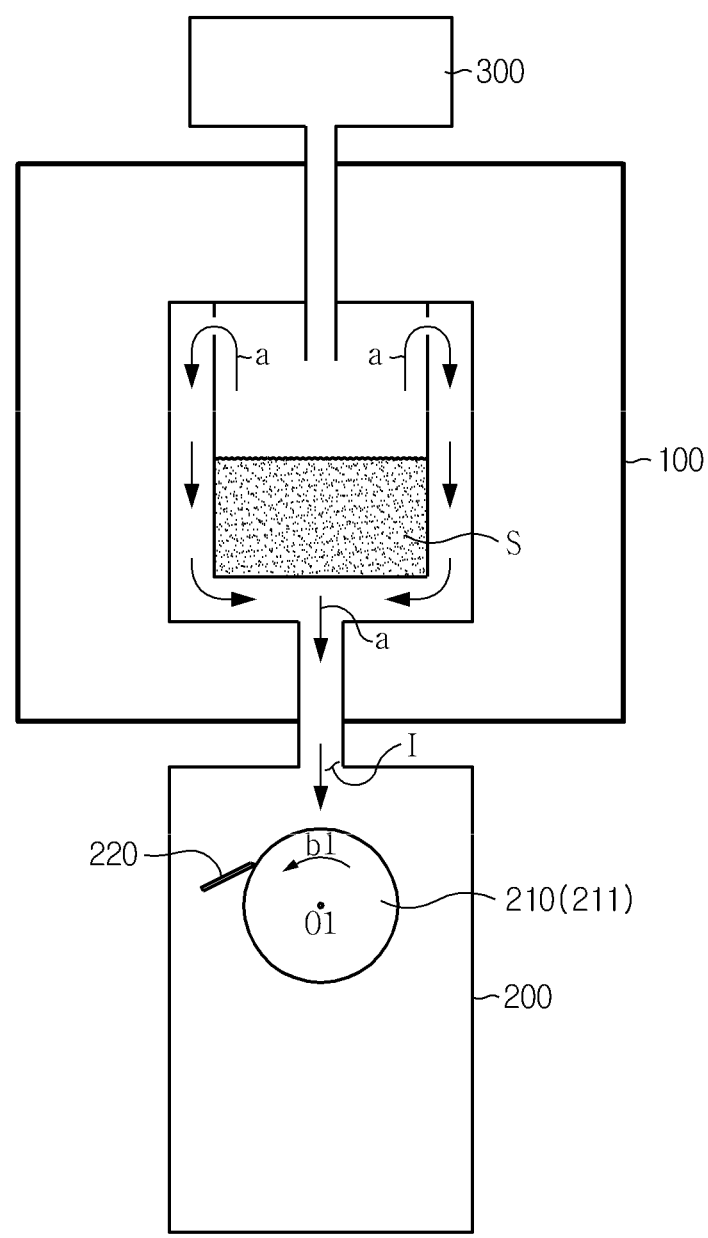
FIG. 2 is a cross-sectional view schematically showing an apparatus for manufacturing SiO according to a first aspect of the present disclosure.

In addition, FIG. 2 is a cross-sectional view schematically showing an apparatus for manufacturing SiO according to a first aspect of the present disclosure.

Referring to FIGS. 1 and 2, an apparatus for manufacturing SiO according to the present disclosure includes a reaction unit 100 and a collecting unit 200.

The reaction unit 100 has an empty space therein, and a SiO-making material is supplied to the inner space of the reaction unit 100. Here, the SiO-making material S is a material used for making SiO and may include two or more substances. For example, the reaction unit 100 may include silicon dioxide ($SiO_2$) serving as the SiO-making material S as well as a material for reducing the silicon dioxide into silicon oxide. Here, the material for reducing silicon dioxide may include silicon-contained substances or carbon-contained substances. However, in the present disclosure, the SiO-making material S may additionally include various substances.

Meanwhile, the reaction unit 100 may receive the SiO-making material S in a powder form. For example, the reaction unit 100 may receive silicon dioxide powder and silicon powder as the SiO-making material S. However, the present disclosure is not limited to such a specific SiO-making material S supplied to the reaction unit 100, and the SiO-making material S may also be supplied in any form other than powder.

The reaction unit 100 brings the supplied SiO-making material S into reaction to generate a SiO (silicon oxide) gas. In other words, reaction unit 100 allows SiO-making materials S into reaction with each other to be chemically composed, and also allows a SiO gas to be generated through this chemical reaction.

For this, the reaction unit 100 may give suitable conditions for the SiO-making materials to react with each other.

In particular, the reaction unit 100 may heat materials so that the materials may actively react with each other. For this, the reaction unit 100 may include a heater for heating materials. Preferably, the reaction unit 100 may maintain a temperature of the inner space in a range of 1200° C. to 1500° C. by means of the heater. In this temperature range, reactivity of silicon dioxide powder and silicon powder may be particularly improved, which facilitates the generation of SiO gas.

In addition, the reaction unit 100 may maintain the inner space in an inert gas atmosphere or vacuum atmosphere for good reaction among materials.

Moreover, for enhancing reactivity among materials, the reaction unit 100 may have a function of mixing the supplied materials. For example, the reaction unit 100 may receive silicon dioxide powder and silicon powder, respectively, and then stir the silicon dioxide powder and the silicon powder so as to be mixed with each other. In addition, the reaction unit 100 may also receive a mixed powder in which the silicon dioxide powder and the silicon powder are mixed.

If the reaction unit 100 heats the mixed materials in an inert gas atmosphere or vacuum atmosphere as described above, the mixed materials may react with each other and form a SiO gas, namely SiO in a gas state. In addition, the formed SiO gas may move through a passage provided in the reaction unit 100 as indicated by the arrow a in FIG. 2 and be introduced to the collecting unit 200.

The collecting unit 200 has an inner space formed therein, and an inlet I is formed at least at one side of the inner space. Therefore, the SiO gas generated in the reaction unit 100 may be introduced to the inner space of the collecting unit 200 through the inlet I. In addition, the collecting unit 200 may solidify the SiO gas introduce into the inner space to form a SiO solid.

In particular, in the present disclosure, the collecting unit 200 includes a rotating member 210 in the inner space. The rotating member 210 is configured to be rotatable in the inner space of the collecting unit 200.

Preferably, the rotating member 210 may include a rotating body 211 which rotates based on a central axis O1, as shown in FIG. 2. In particular, the rotating member 210 may be configured with a single rotating body 211, and in this case, the rotating body 211 may serve as the rotating member 210.

Preferably, the rotating body 210 may have a cylindrical shape. In this case, the rotating body 211 may be configured to rotate in a circumferential direction based on the central axis O1, as indicated by the arrow b1 in FIG. 2.

As described above, the collecting unit 200 includes the rotating member 210, namely the rotating body 211, in the inner space, and the SiO gas introduced into the collecting unit 200 may be deposited to a surface of the rotating body 211 and solidified, thereby changing its state into a SiO deposit.

In order to allow the SiO gas to be easily deposited to the surface of the rotating body 211 and solidified, the collecting unit 200 may maintain its internal temperature lower than the internal temperature of the reaction unit 100.

For example, the collecting unit 200 may maintain the internal temperature in a range of 200° C. to 500° C. In this temperature range, the SiO gas may be cooled better, and thus the SiO gas may be deposited and solidified more effectively at the surface of the rotating body 211. In this case, the collecting unit 200 may control the inner space to have a temperature of 200° C. to 500° C. or control the rotating body 211 to have a surface temperature of 200° C. to 500° C.

SiO deposited to the surface of the rotating member 210, namely the rotating body 211, and solidified as described above may drop down below the rotating body 211 as the rotating body 211 rotates. In other words, SiO in a solid state present at the surface of the rotating body 211, namely the SiO deposit, may fall down from the surface of the rotating body 211 and be collected since a gravity and a centrifugal force are applied as the rotating body 211 rotates. Therefore, the collecting unit 200 may collect the SiO deposit in this way.

Preferably, the collecting unit 200 may further include a removing member 220, as shown in FIG. 2.

The removing member 220 is used for separating the SiO deposit from the surface of the rotating body 211.

Figure 3:
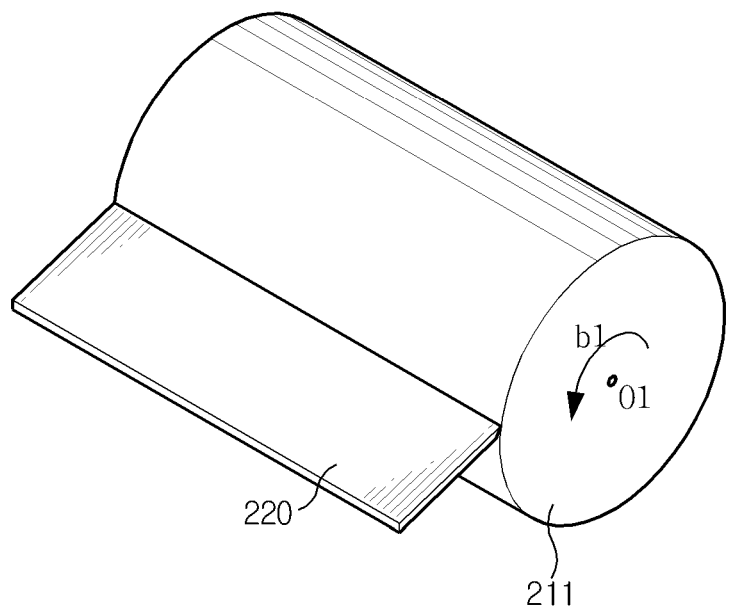
FIG. 3 is a perspective view schematically showing a removing member and a rotating member according to an embodiment of the present disclosure.

FIG. 3 is a perspective view schematically showing the removing member 220 and the rotating body 211 according to an embodiment of the present disclosure.

As shown in FIG. 3, the removing member 220 may be configured to have a plate form. In addition, the removing member 220 having a plate form may be configured so that at least one edge thereof contacts the surface of the rotating body 211.

In this embodiment, the SiO deposit present at the surface of the rotating body 211 may be more easily separated from the surface of the rotating body 211 by means of the removing member 220. In particular, the rotating body 211 may rotate in a circumferential direction, and the removing member 220 may scrape out the SiO deposit present at or adhered to the surface of the rotating body 211 as long as the removing member 220 is fixed in contact with the surface of the rotating body 211 at a specific location.

In this case, the edge of the removing member 220, which is in contact with the surface of the rotating body 211, may have a length capable of covering the entire width of the rotating body 211. In other words, the edge of the removing member 220 may have a length similar to or greater than the width of the rotating body 211.

In this embodiment, even though the removing member 220 is fixed to a specific location, SiO deposits adhered to the entire surface of the rotating body 211 may be detached. In other words, if the removing member 220 is configured so that its edges partially contact the surface of the rotating body 211 at a fixed location as shown in FIG. 3, even though the removing member 220 does not move along the surface of the rotating body 211, the removing member 220 may scrape the SiO deposits adhered to the entire surface of the rotating body 211 as the rotating body 211 rotates in a circumferential direction.

More preferably, the removing member 220 may be inclined so that an end thereof contacting the surface of the rotating member 211 is higher than an end opposite thereto. For example, if a right end of the removing member 220 contacts the surface of the rotating body 211 as shown in FIG. 2, the removing member 220 may be inclined so that its right end is located higher than the left end.

In this embodiment, SiO deposits scraped by the removing member 220 are not stacked on the removing member 220 but easily fall down. In other words, in the configuration of FIG. 2, SiO deposits scraped at the right end of the removing member 220 are placed on the right end of the removing member 220, but since the top surface of the removing member 220 is inclined so that its left end is lower than the right end, the SiO deposits placed on the right end move toward the left end and eventually drop out of the removing member 220. Therefore, the SiO deposits may be automatically collected at the lower end of the collecting unit 200, and thus the SiO deposits may be more easily collected by the collecting unit 200.

Meanwhile, the location of the removing member 220 depicted in FIGS. 2 and 3 is just an example, and the removing member 220 may be provided at various locations where SiO deposits present at the surface of the rotating body 211 may be scraped.

Figure 4:
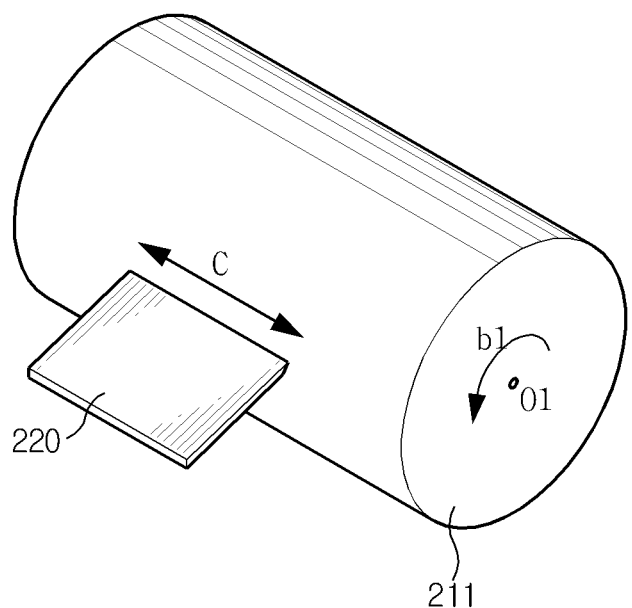
FIG. 4 is a perspective view schematically showing a removing member and a rotating member according to another embodiment of the present disclosure.

FIG. 4 is a perspective view schematically showing the removing member 220 and the rotating body 211 according to another embodiment of the present disclosure.

Referring to FIG. 4, the removing member 220 may have a length shorter than the length of the rotating body 211 in a width direction. In this case, the removing member 220 may move in a width direction of the rotating body 211, as indicated by the arrow c. In other words, with respect to the rotating body 211 rotating in a circumferential direction (in a direction of b1), the removing member 220 may scrape SiO deposits adhered to the surface of the rotating body 211 while moving in a right and left direction (in a direction of c) in a state where its one edge contacts the surface of the rotating body 211.

In this embodiment, even though the rotating body 211 is not designed to have a great size corresponding to the width of the removing member 220, SiO deposits adhered to the entire surface of the rotating body 211 may be detached.

Figure 5:
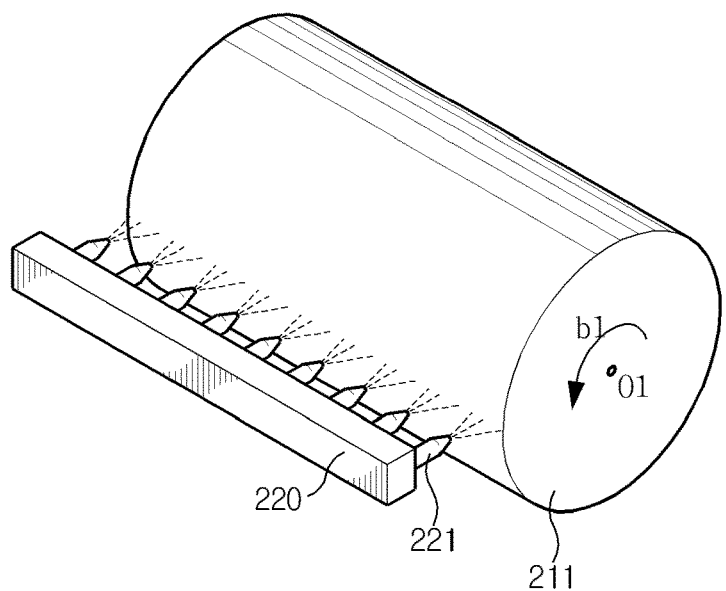
FIG. 5 is a perspective view schematically showing a removing member and a rotating member according to another embodiment of the present disclosure.

FIG. 5 is a perspective view schematically showing the removing member 220 and the rotating body 211 according to another embodiment of the present disclosure.

Referring to FIG. 5, the removing member 220 may be implemented to inject a gas to the surface of the rotating body 211. In other words, the removing member 220 may include at least one injection nozzle 221 and inject a gas through the injection nozzle 221 so that the SiO deposits present at the surface of the rotating body 211 may be separated from the surface of the rotating body 211 by the pressure of the injected gas.

Therefore, the removing member 220 may inject a gas with a high pressure so that the SiO deposits adhered to the surface of the rotating body 211 may be easily detached.

Here, the removing member 220 may inject an inert gas so that the SiO deposit or SiO gas is not composed or converted into another form due to the injected gas.

Meanwhile, regarding a gas injection pattern, the removing member 220 may also be configured to be fixed at a specific location or movable in a width direction of the rotating body 211.

Also preferably, the collecting unit 200 may control the internal temperature by using the gas injected by the removing member 220. In other words, the collecting unit 200 may inject a gas through the removing member 220 so that the SiO deposit is separated from the surface of the rotating body 211 and also the internal temperature is controlled to an appropriate temperature.

For example, the collecting unit 200 may maintain the internal temperature at an appropriate temperature, for example in a range of 200° C. to 500° C., by injecting a cooling gas by the removing member 220. In this case, if the internal temperature drops below the appropriate temperature, the collecting unit 200 decreases the amount of an injected gas or rise the temperature of the injected gas so that the internal temperature does not drop below the appropriate temperature. On the contrary, if the internal temperature rises over the appropriate temperature, the collecting unit 200 may increase the amount of an injected gas or drop the temperature of the injected gas so that the internal temperature does not rise over the appropriate temperature.

In this embodiment, by injecting the cooling gas by means of the removing member 220, the collecting unit 200 may easily separate the SiO deposit from the surface of the rotating body 211 and also maintain the internal temperature at an appropriate temperature, for example a temperature in which SiO may be easily deposited and solidified.

More preferably, the collecting unit 200 may cool the surface of the rotating body 211 by using the gas injected by the removing member 220. In other words, the collecting unit 200 may inject the cooling gas to the surface of the rotating body 211 so that the surface of the rotating body 211 is cooled. In this case, since the surface temperature of the rotating body 211 is maintained low in comparison to other regions in the collecting unit 200, SiO may be deposited more easily to the surface of the rotating body 211. Therefore, in this embodiment, a SiO collection rate may be improved further.

Also preferably, the removing member 220 may be configured to vibrate the rotating body 211, namely the rotating member 210.

In this embodiment of the present disclosure, the rotating member 210 may be vibrated by the removing member 220, and the vibration of the rotating member 210 may detach the SiO deposit from the surface of the rotating member 210.

In this case, in order to facilitate the separation of the SiO deposit and improve a separation speed, the removing member 220 may further include a component for scraping the surface of the rotating member 210 as shown in FIGS. 2 to 5, in addition to the component for vibrating the rotating member 210.

Meanwhile, as shown in FIG. 2, the rotating body 211 may be located at the inlet I in the collecting unit 200 through which a SiO gas is introduced. In the present disclosure, the SiO gas is deposited to the surface of the rotating body 211 and solidified, and thus it will be more advantageous in aspect of SiO deposition if the rotating body 211 is located at a side where the SiO gas is introduced. Therefore, the rotating body 211 may be located at the inlet of the collecting unit 200. Here, if the rotating body 211 is located at the inlet I of the collecting unit 200, this may mean that another article is not present between the inlet I and the rotating body 211 in the inner space of the collecting unit. In particular, another article may not be present in a linear path between the inlet I and the rotating body 211 in a flow direction of a fluid introduced through the inlet. In this case, a SiO gas introduced through the inlet may directly contact the rotating body 211 for the first time without any disturbance of another article.

Figure 6:
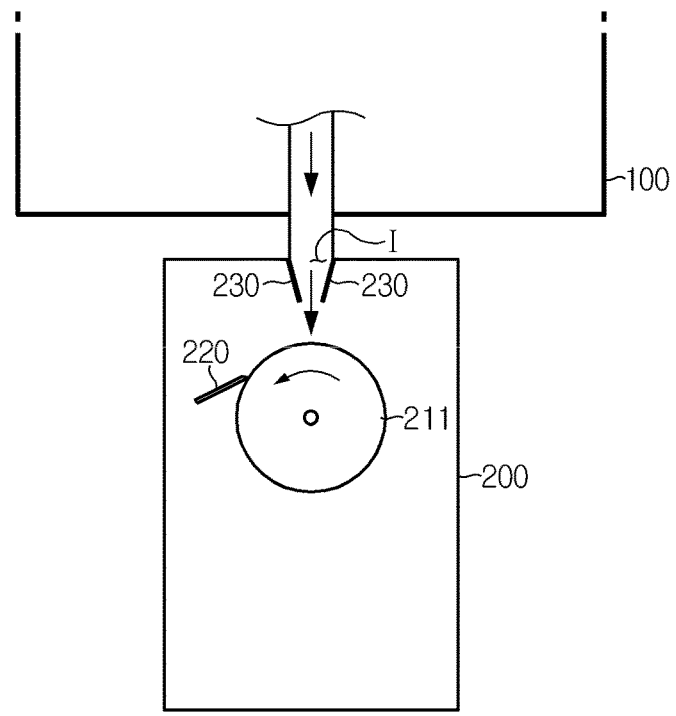
FIG. 6 is a cross-sectional view schematically showing a collecting unit according to another embodiment of the present disclosure.

FIG. 6 is a cross-sectional view schematically showing the collecting unit 200 according to another embodiment of the present disclosure.

Referring to FIG. 6, the collecting unit 200 may further include a guide tube 230.

Here, one end of the guide tube 230 may be connected to the inlet I of the collecting unit 200, and the other end may extend near to the rotating member 210, namely the rotating body 211. Therefore, the collecting unit 200 may easily guide the SiO gas introduced through the inlet to the rotating body 211. For this reason, in this embodiment, since the SiO gas introduced to the collecting unit 200 may be directly guided to the surface of the rotating body 211 as a whole, the SiO gas may be easily deposited to the surface of the rotating body 211, which may further improve a collection rate of the SiO deposit.

Preferably, the collecting unit 200 may maintain the inner space in a decompressed state in order to facilitate deposition and solidification of the SiO gas. Here, the decompressed state means a state in which the inner pressure is lower than a normal pressure, which includes a vacuum state. For this, the collecting unit 200 may include at least one vacuum pump and valve.

Meanwhile, the apparatus for manufacturing SiO according to the present disclosure may further include a supplying unit 300, as shown in FIG. 1.

The supplying unit 300 stores materials required for making SiO and supplies these materials to the reaction unit 100. For example, the supplying unit 300 may store silicon dioxide powder and silicon powder as the SiO-making material and supply them to the inner space of the reaction unit 100. At this time, the supplying unit 300 may mix these material powders at a suitable ratio and supply the mixed powder to the reaction unit 100.

If the apparatus for manufacturing SiO includes the supplying unit 300 as described above, the SiO-making material may be automatically supplied to the reaction unit 100, which allows SiO to be made more continuously and rapidly.

Figure 7:
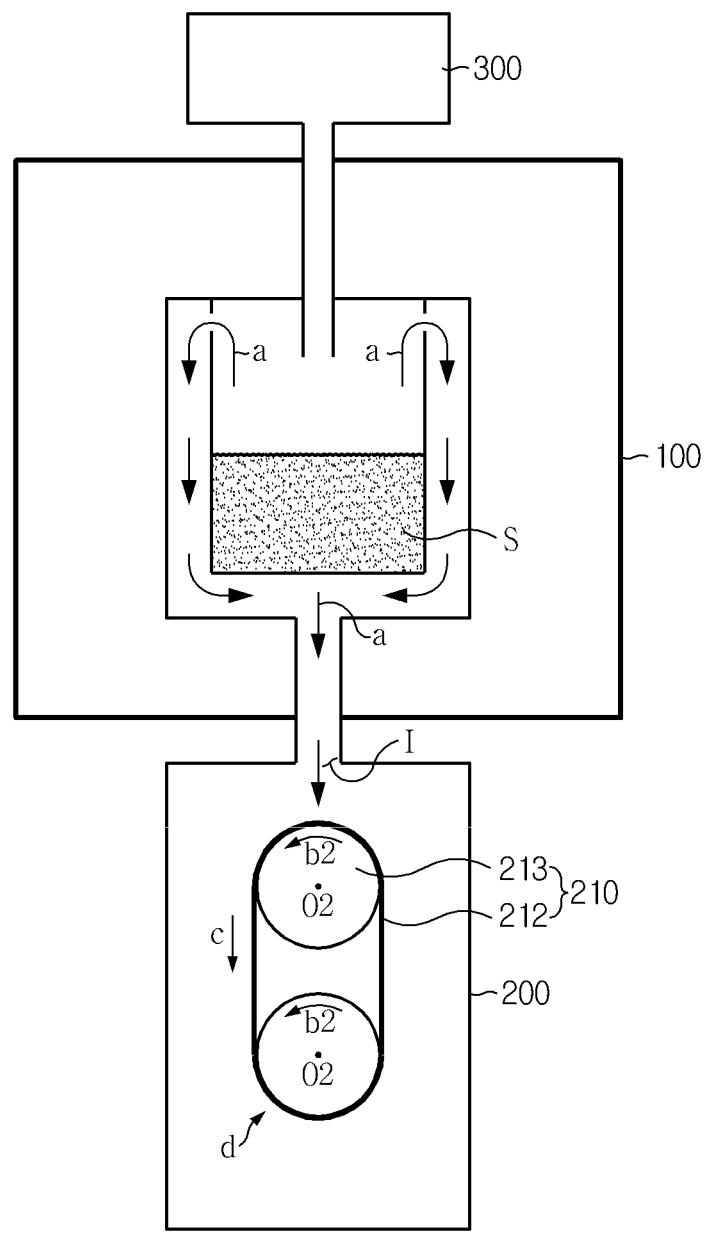
FIG. 7 is a cross-sectional view schematically showing an apparatus for manufacturing SiO according to a second aspect of the present disclosure.

FIG. 7 is a cross-sectional view schematically showing an apparatus for manufacturing SiO according to a second aspect of the present disclosure.

Referring to FIGS. 1 and 7, the apparatus for manufacturing SiO according to the present disclosure includes a reaction unit 100 and a collecting unit 200.

The reaction unit 100 has an empty space therein, and a SiO-making material S is supplied to the inner space of the reaction unit 100. Regarding the reaction unit 100, the description in relation to the embodiment depicted in FIG. 2 may be similarly applied, and thus the reaction unit 100 will not be described in detail here.

The reaction unit 100 brings the supplied SiO-making material S into reaction to generate a SiO gas. For this, the reaction unit 100 may give suitable conditions for the SiO-making materials to react with each other. In particular, the reaction unit 100 may heat materials so that the materials may actively react with each other. For this, the reaction unit 100 may include a heater for heating materials.

In addition, the reaction unit 100 may maintain the inner space in an inert gas atmosphere or vacuum atmosphere for good reaction among materials.

Moreover, for enhancing reactivity among materials, the reaction unit 100 may have a function of mixing the supplied materials.

If the reaction unit 100 heats the mixed materials in an inert gas atmosphere or vacuum atmosphere as described above, the mixed materials may react with each other and form a SiO gas, namely SiO in a gas state. In addition, the formed SiO gas may move through a passage provided in the reaction unit 100 as indicated by the arrow a in FIG. 7 and be introduced to the collecting unit 200.

The collecting unit 200 has an inner space formed therein, and an inlet I is formed at least at one side of the inner space. Therefore, the SiO gas generated in the reaction unit 100 may be introduced to the inner space of the collecting unit 200 through the inlet I. In addition, the collecting unit 200 may solidify the SiO gas introduce into the inner space to form a SiO solid.

In particular, in an embodiment of the present disclosure, the collecting unit 200 includes a rotating member 210 in the inner space, and the rotating member 210 is configured in a form of a belt conveyor in the inner space, as shown in FIG. 7.

Here, the rotating member 210 includes a wheel 213 which rotates in a circumferential direction based on a central axis O2 and a belt 212 which is in contact with an outer circumference of the wheel 213 and moves in a length direction according to a rotation of the wheel 213. For example, referring to FIG. 7, the rotating member 210 may include a plurality of wheels 213, and if the wheel 213 moves in a direction of b2, the belt 212 contacting the surface of the wheel 213 may move in a direction of c. At this time, the wheel 213 may be connected to a rotary shaft of a motor or the like to receive a driving force. The driving force may be supplied to the plurality of wheels 213 simultaneously or only to a part of the wheels 213.

As described above, the collecting unit 200 includes the rotating member 210 in the inner space, and the SiO gas introduced into the collecting unit 200 is deposited to and solidified at the surface of the rotating member 210, particularly the surface of the belt 212, thereby changing its state into a SiO deposit.

In order to allow the SiO gas to be easily deposited to the surface of the belt 212 and solidified, the collecting unit 200 may maintain its internal temperature lower than the internal temperature of the reaction unit 100.

For example, the collecting unit 200 may maintain the internal temperature in a range of 200° C. to 500° C. In this temperature range, the SiO gas may be cooled better, and thus the SiO gas may be deposited and solidified more effectively at the surface of the belt 212. In this case, the collecting unit 200 may control the inner space to have a temperature of 200° C. to 500° C. or control the belt 212 to have a surface temperature of 200° C. to 500° C.

SiO deposited to the surface of the belt 212 and solidified as described above may drop down below the rotating member 210 as the rotating member 210 rotates.

First, SiO in a solid state present at the surface of the belt 212, namely the SiO deposit, may fall down from the surface of the belt 212 due to gravity when the belt 212 is perpendicular to the ground or inclined by a predetermined angle from the ground.

Moreover, the SiO deposit present at the surface of the belt 212 may fall down from the belt 212 due to a tension applied to the belt 212, at a portion where the belt 212 comes into contact with the wheel 213 as indicated by d. In other words, the belt 212 moves while it partially contacts the wheel 213 when the wheel 213 rotates, and a portion of the belt 212 which is in contact with the wheel 213 may be tightly pulled. In addition, when the belt 212 is pulled as described above, the SiO deposit present at the surface of the belt 212, particularly the SiO deposit solidified at the surface of the belt 212, may fall down from the belt 212 and be collected.

Therefore, the collecting unit 200 may collect the SiO deposit in this way.

Preferably, the collecting unit 200 may move the belt 212 by rotating the wheel 213 while a SiO gas is being introduced. In this case, the SiO gas is deposited to the surface of the belt 212 at the inlet I and is gradually solidified during its movement, and thus when reaching a location contacting the wheel 213 as indicated by d, the SiO gas may be separated from the belt 212 as a SiO deposit. In addition, a SiO gas may be deposited again to the surface of the belt 212 from which the SiO deposit is separated. Therefore, in this embodiment, SiO may be deposited, solidified and separated continuously and repeatedly, which facilitates continuous production of SiO and thus effectively shortens the time required for making SiO.

Meanwhile, at least one of the wheels 213 in the rotating member 210 may have a circular shape in its front form, as shown in FIG. 7. Here, the front side means a surface (or, a portion) not in contact with the belt 212. For example, the wheel 213 may have a cylindrical shape, and in this case, the front form of the wheel 213 has a circular shape. In addition, the belt 212 may come into contact with a side of the wheel 213. In this embodiment, the wheel 213 may come into a flat contact with the inner surface of the belt 212, and thus a tension may be regularly applied to the wheel 213. Therefore, the SiO deposit may be easily separated from the entire surface of the belt 212, and the SiO deposit does not partially remain on the surface of the belt 212 due to a portion to which a tension is not applied.

However, the present disclosure is not limited to this embodiment, and the wheel 213 may also have another shape. In particular, at least one of the wheels 213 included in the rotating member 210 may have a polygonal shape in its front form.

Figure 8:
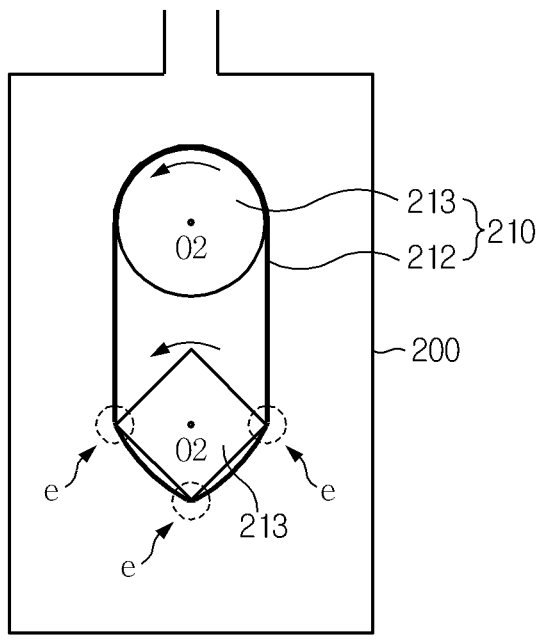
FIG. 8 is a front view schematically showing a collecting unit according to another embodiment of the present disclosure.
Figure 9:
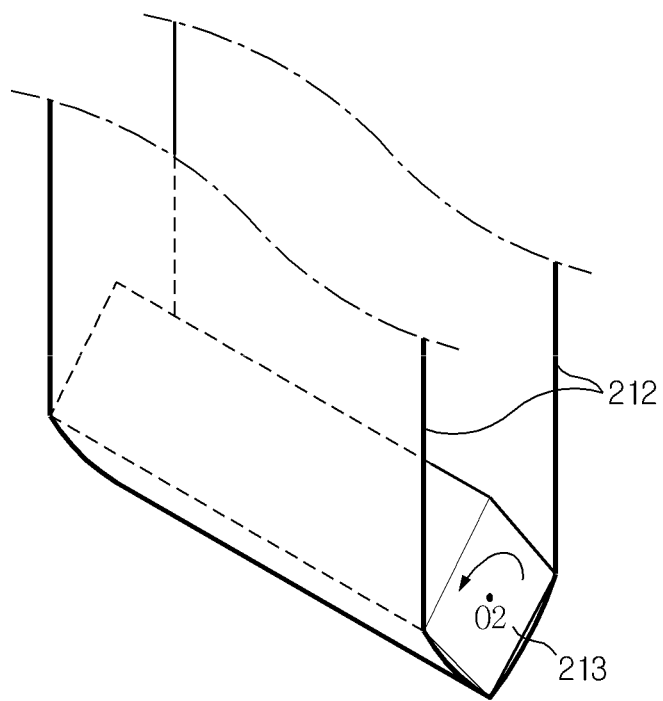
FIG. 9 is a perspective view schematically showing a wheel located at a lower portion and a belt contacting the wheel in the configuration of FIG. 8.

FIG. 8 is a front view schematically showing a collecting unit 200 according to another embodiment of the present disclosure. In addition, FIG. 9 is a perspective view schematically showing the wheel 213 located at a lower portion and the belt 212 contacting the wheel in the configuration of FIG. 8. However, for convenience, the belt 212 is depicted transparently in FIG. 9.

Referring to FIGS. 8 and 9, at least one of the wheels 213 included in the rotating member 210 may have a rectangular shape in its front form. In other words, the wheel 213 may have a square pillar shape. In this configuration, as indicated by e in the figures, a greater tension is applied to the belt 212 at a portion where an edge of the wheel 213 contacts the belt 212, which may allow the belt 212 to be pulled more tightly. Therefore, in this embodiment, the SiO deposit attached to the belt 212, particularly the SiO deposit more strongly adhered to the belt 212, may be easily separated.

Further, the rotating member 210 may include two wheels 213, and two wheels 213 may be disposed at an upper portion and a lower portion, respectively, in the collecting unit 200. In this case, as shown in FIG. 8, one of the two wheels 213 may have a cylindrical shape, and the other wheel 213 may have a square pillar shape. In this embodiment, since the two wheels 213 have different shapes, a tension is regularly applied to the entire belt 212 when the belt 212 comes in contact with the wheel 213 having a cylindrical shape, and a greater tension may be applied to a specific portion of the belt 212 when the belt 212 comes in contact with the wheel 213 having a square pillar shape. Therefore, the SiO deposit present at the surface of the belt 212 may be effectively separated from the belt 212.

In particular, if one wheel 213 has a square pillar shape as described above, the wheel 213 having a square pillar shape may be disposed at a lower portion. In this case, a greater tension is applied when the belt 212 comes into contact with the wheel 213 located at a lower portion, and thus the SiO deposit present at the surface of the belt 212 may be separated from the belt 212 more when the belt 212 comes into contact with the wheel 213 located at a lower portion. In this embodiment, since the SiO deposit present at the surface of the belt 212 may fall down directly below the rotating member 210, the SiO deposit may be separated from the belt 212 and collected more effectively.

Meanwhile, even though FIGS. 8 and 9 depicts that at least one wheel 213 has a square pillar shape, the wheel 213 may also have various polygonal shapes in its front form, for example, a trigonal pillar, a pentagonal pillar, a hexagonal pillar or the like.

Also preferably, unevenness may be formed at a surface of at least one of the wheels 213, which is in contact with the belt 212.

Figure 10:
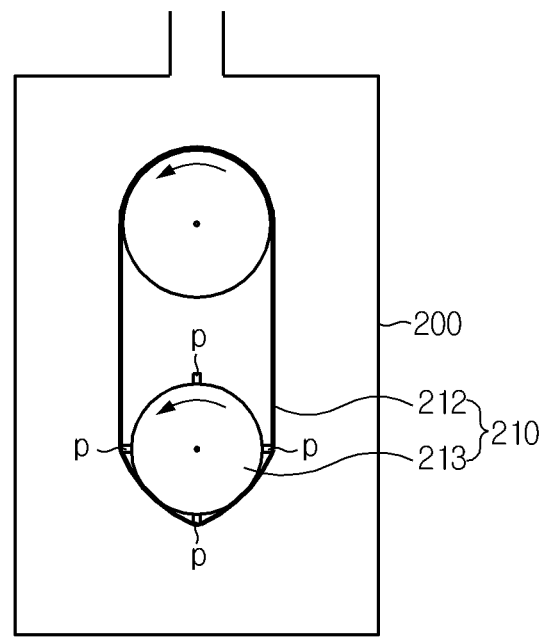
FIG. 10 is a front view schematically showing a collecting unit according to another embodiment of the present disclosure.
Figure 11:
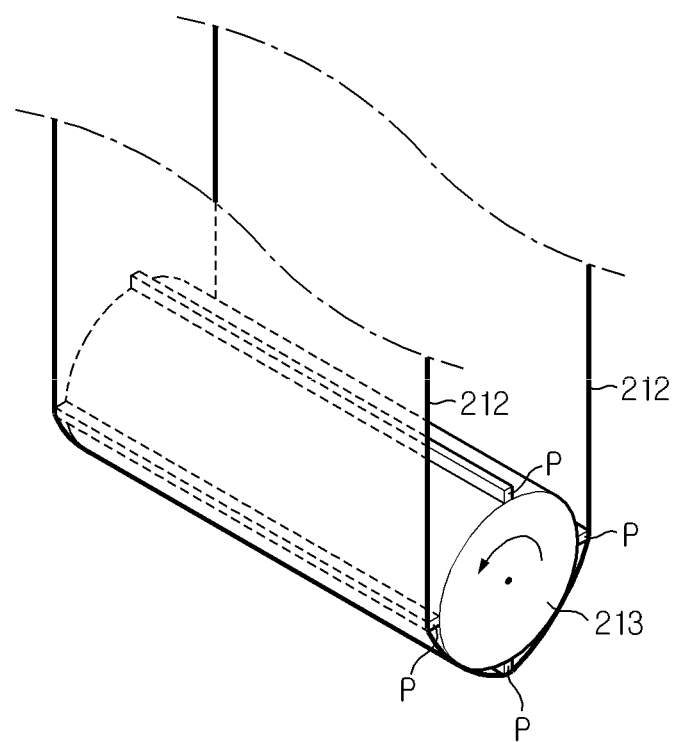
FIG. 11 is a perspective view schematically showing a wheel located at a lower portion and a belt contacting the wheel in the configuration of FIG. 10.

FIG. 10 is a front view schematically showing a collecting unit 200 according to another embodiment of the present disclosure. In addition, FIG. 11 is a perspective view schematically showing a wheel 213 located at a lower portion and a belt 212 contacting the wheel in the configuration of FIG. 10. However, for convenience, the belt 212 is depicted transparently in FIG. 11.

Referring to FIGS. 10 and 11, unevenness may be formed at a surface of at least one of the wheels 213 in the rotating member 210, which is in contact with the belt 212. For example, as shown in the figures, when the wheel 213 has a cylindrical shape in which a front surface and a rear surface are circular, the belt 212 contacts a side of the wheel 213, and the unevenness may be prepared by forming a convex portion P at the side of the wheel 213.

In this embodiment, a stronger tension may be applied to the belt 212 at a portion where the unevenness is formed, particularly at a portion where the convex portion P is formed, and thus the SiO deposit placed on or attached to the belt 212 may effectively fall down from the belt 212.

More preferably, the unevenness may be formed in a rotating direction of the wheel 213. For example, as shown in FIG. 11, the unevenness may be prepared by disposing convex portions P at predetermined intervals along a circumferential direction of the cylindrical wheel 213. In addition, the convex portion P may be elongated along a side of the wheel 213. In this embodiment, when the belt 212 moves in a length direction, the convex portion P or a concave portion is identically disposed in a width direction, and thus a tension may be regularly applied over the entire width of the belt 212. Therefore, it is possible to prevent that a tension is not properly applied to a portion of the entire width of the belt 212 and thus the SiO deposit remains.

Also preferably, the collecting unit 200 may further include a removing member. The removing member is a component capable of separating the SiO deposit from the surface of the belt 212.

Figure 12:
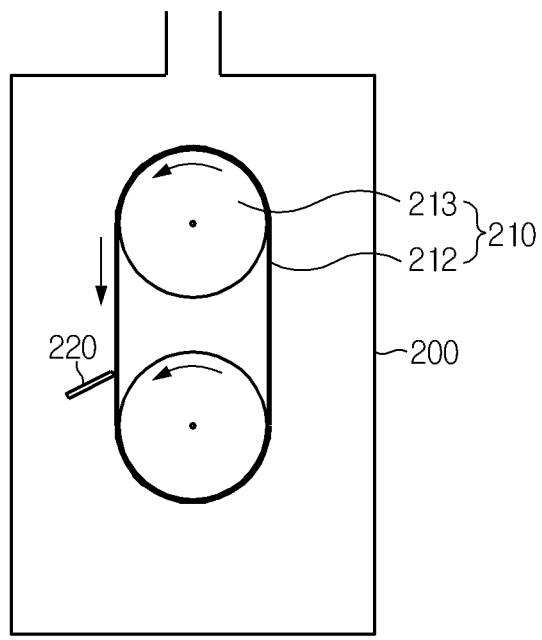
FIG. 12 is a front view schematically showing a collecting unit according to another embodiment of the present disclosure.

FIG. 12 is a front view schematically showing a collecting unit 200 according to another embodiment of the present disclosure. In addition, FIG. 13 is a perspective view schematically showing a wheel 213, a belt 212 and a removing member 220, which are located at a lower portion in the configuration of FIG. 12.

Figure 13:
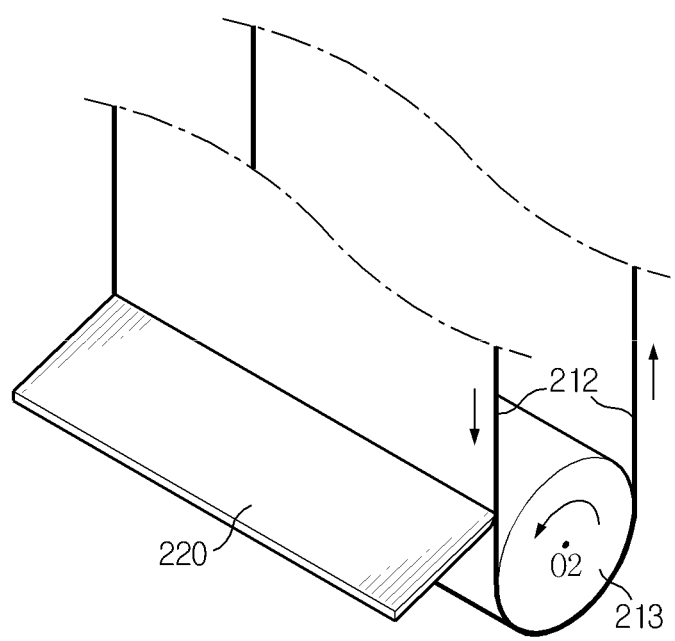
FIG. 13 is a perspective view schematically showing a wheel, a belt and a removing member, which are located at a lower portion in the configuration of FIG. 12.

Referring to FIGS. 12 and 13, the removing member 220 may have a plate form. In addition, the removing member 220 having a plate form may be configured so that at least one edge thereof comes into contact with the surface of the belt 212.

In this embodiment, the SiO deposit present at the surface of the belt 212 may be more easily separated from the surface of the belt 212 by means of the removing member 220. In particular, the belt 212 may rotate in a length direction as indicated by an arrow, and the removing member 220 may scrape out the SiO deposit present at or adhered to the surface of the belt 212 as long as the removing member 220 is fixed in contact with the surface of the belt 212 at a specific location. Moreover, even though the SiO deposit is not directly removed by the removing member 220, if a pressure is applied to the SiO deposit at the surface of the belt 212 by means of the removing member 220, the SiO deposit may be separated more easily when the belt 212 is pulled by the wheel 213.

More preferably, the edge of the removing member 220, which is in contact with the surface of the belt 212, may have a length capable of covering the entire width of the belt 212. In other words, the edge of the removing member 220 may have a length similar to or greater than the width of the belt 212.

In this embodiment, even though the removing member 220 is fixed to a specific location, SiO deposits adhered to the entire surface of the belt 212 may be detached. In other words, if the removing member 220 is configured so that its edges partially contact the surface of the belt 212 at a fixed location as shown in FIGS. 12 and 13, even though the removing member 220 does not move in a width direction, the removing member 220 may detach the SiO deposits adhered to the entire surface of the belt 212 according to the movement of the belt 212.

Meanwhile, the removing member 220 may have a length shorter than the length of the belt 212 in a width direction. In this case, the removing member 220 may separate SiO deposit from the entire width of the belt 212 while moving in a width direction of the belt 212.

Figure 14:
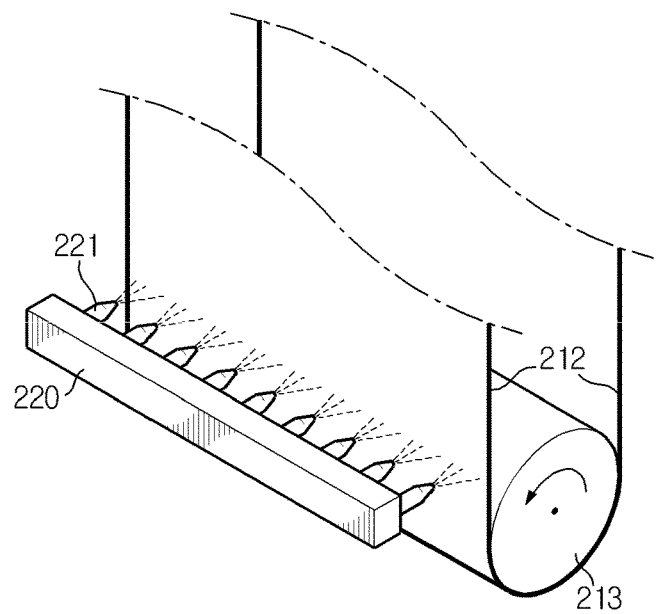
FIG. 14 is a perspective view schematically showing a removing member according to another embodiment of the present disclosure.

FIG. 14 is a perspective view schematically showing a removing member 220 according to another embodiment of the present disclosure.

Referring to FIG. 14, the removing member 220 may be implemented to inject a gas to the surface of the belt 212. In this case, the removing member 220 may include at least one injection nozzle 221 and inject a gas through the injection nozzle 221 so that the SiO deposits present at the surface of the belt 212 may be separated from the surface of the belt 212 by the pressure of the injected gas.

Therefore, the removing member 220 may inject a gas with a high pressure so that the SiO deposits adhered to the surface of the belt 212 may be easily detached.

Here, the removing member 220 may inject an inert gas so that the SiO deposit or SiO gas is not composed or converted into another form due to the injected gas.

Meanwhile, regarding a gas injection pattern, the removing member 220 may also be configured to be fixed at a specific location or movable in a width direction of the belt 212.

Also preferably, the collecting unit 200 may control the internal temperature by using the gas injected by the removing member 220. In other words, the collecting unit 200 may inject a gas through the removing member 220 so that the SiO deposit is separated from the surface of the belt 212 and also the internal temperature is controlled to an appropriate temperature.

For example, the collecting unit 200 may maintain the internal temperature at an appropriate temperature, for example in a range of 200° C. to 500° C., by injecting a cooling gas by the removing member 220. In this case, if the internal temperature drops below the appropriate temperature, the collecting unit 200 decreases the amount of an injected gas or rise the temperature of the injected gas so that the internal temperature does not drop below the appropriate temperature. On the contrary, if the internal temperature rises over the appropriate temperature, the collecting unit 200 may increase the amount of an injected gas or drop the temperature of the injected gas so that the internal temperature does not rise over the appropriate temperature.

In this embodiment, by injecting the cooling gas by means of the removing member 220, the collecting unit 200 may easily separate the SiO deposit from the surface of the belt 212 and also maintain the internal temperature at an appropriate temperature, for example a temperature in which SiO may be easily deposited and solidified.

More preferably, the collecting unit 200 may cool the surface of the belt 212 by using the gas injected by the removing member 220. In other words, the collecting unit 200 may inject the cooling gas to the surface of the belt 212 so that the surface of the belt 212 is cooled. In this case, since the surface temperature of the belt 212 is maintained low in comparison to other regions in the collecting unit 200, SiO may be deposited more easily to the surface of the belt 212. Therefore, in this embodiment, a SiO collection rate may be improved further.

Also preferably, the removing member 220 may be configured to vibrate the belt 212 and/or the wheel 213.

In this embodiment of the present disclosure, the rotating member 210, namely the belt 212 and/or the wheel 213, may be vibrated by the removing member 220, and the vibration of the belt 212 and/or the wheel 213 may detach the SiO deposit from the surface of the belt 212.

In this case, in order to facilitate the separation of the SiO deposit and improve a separation speed, the removing member 220 may further include a component for scraping the surface of the belt 212 as shown in FIGS. 12 to 14, in addition to the component for vibrating the belt 212 and/or the wheel 213.

Meanwhile, as shown in various figures, the rotating member 210 may be at least partially located at the inlet in the collecting unit 200. In the present disclosure, the SiO gas is deposited to the surface of the rotating body 211 and solidified, and thus it will be more advantageous in aspect of SiO deposition if the belt 212 is located at a side where the SiO gas is introduced. Therefore, the rotating member 210 may be at least partially located at the inlet of the collecting unit 200.

Figure 15:
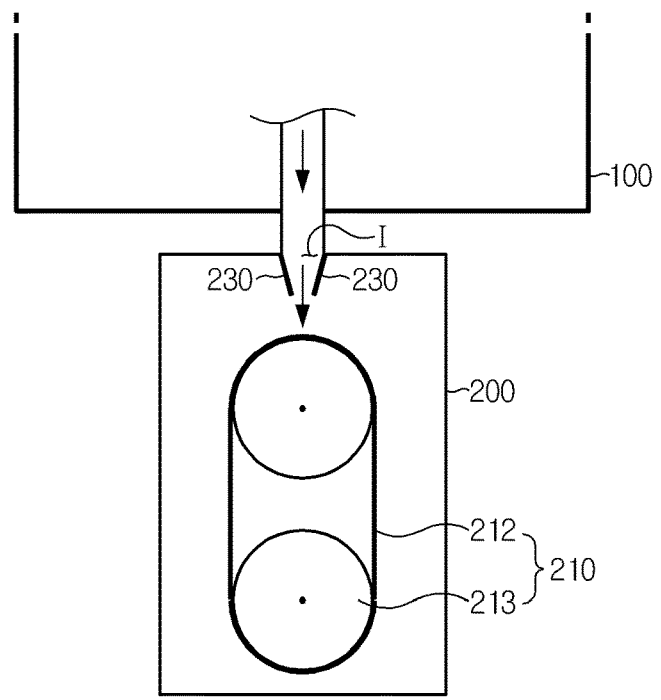
FIG. 15 is a cross-sectional view schematically showing a collecting unit according to another embodiment of the present disclosure.

FIG. 15 is a cross-sectional view schematically showing a collecting unit 200 according to another embodiment of the present disclosure.

Referring to FIG. 15, the collecting unit 200 may further include a guide tube 230.

Here, one end of the guide tube 230 may be connected to the inlet of the collecting unit 200, and the other end may extend near to the rotating member 210. Therefore, the collecting unit 200 may easily guide the SiO gas introduced through the inlet to the surface of the belt 212 of the rotating member 210. For this reason, in this embodiment, since the SiO gas introduced to the collecting unit 200 may be directly guided to the surface of the belt 212 as a whole, the SiO gas may be easily deposited to the surface of the belt 212, which may further improve a collection rate of the SiO deposit.

Preferably, the collecting unit 200 may maintain the inner space in a decompressed state in order to facilitate deposition and solidification of the SiO gas. Here, the decompressed state means a state in which the inner pressure is lower than a normal pressure, which includes a vacuum state. For this, the collecting unit 200 may include at least one vacuum pump and valve.

Meanwhile, even though it is depicted in various figures that the rotating member 210 includes two wheels 213, the rotating member 210 may also include three or more wheels 213.

Figure 16:
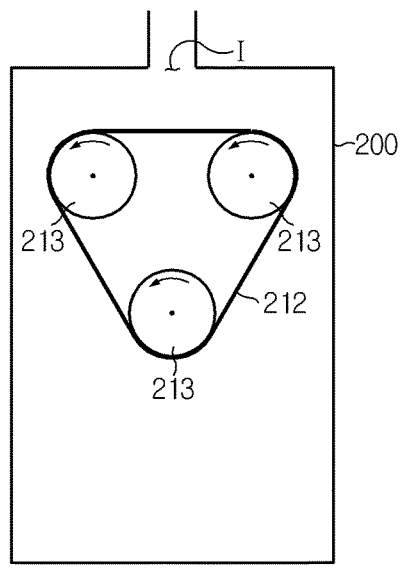
FIG. 16 is a cross-sectional view schematically showing a collecting unit according to another embodiment of the present disclosure.

FIG. 16 is a cross-sectional view schematically showing a collecting unit 200 according to another embodiment of the present disclosure.

Referring to FIG. 16, the collecting unit 200 may include a belt conveyor, namely a rotating member 210, including three or more wheel 213. In this case, the wheels 213 may be disposed at predetermined intervals in a length direction of the belt 212. In addition, the belt 212 may have a bent portion formed by each wheel 213. For example, if the rotating member 210 includes three wheels 213 as shown in FIG. 16, the belt 212 may have three bent portions which configure a triangle in a length direction. In this embodiment, since many bent portions are formed at the belt 212, the SiO deposit may be separated more easily by means of these bent portions, which allows the SiO deposit to be collected more easily.

More preferably, if the belt 212 includes three or more bent portion, the belt 212 may be disposed horizontally at the inlet I of the collecting unit 200. In particular, as shown in FIG. 16, the inlet I may be located at an upper portion of the collecting unit 200 so that the SiO gas introduced into the collecting unit 200 moves downwards from the upper portion. At this time, the rotating member 210 may be provided so that a length direction of the upper portion of the belt 212, namely a length direction of the belt 212 with respect to a portion located at the inlet I, is a horizontal direction. In other words, if the inlet I is located in the upper portion of the collecting unit 200, the belt 212 and the wheel 213 may be disposed so that the length direction of the belt 212 has an inverted triangle, and in this case, a side (a line) of the triangle located in an upper portion may be disposed horizontally at the inlet I. In this case, the SiO gas may be introduced at the inlet I in a direction perpendicular to the length direction of the belt 212. In this embodiment, since the SiO gas introduced through the inlet I moves downwards and is deposited to the belt 212 placed horizontally, the SiO gas may be more easily deposited to the belt 212.

Meanwhile, in an embodiment including three or more wheels 213, the wheels 213 may be disposed in various patterns, without being limited to the above. In addition, at least a part of the wheels 213 may have a circular or polygonal front shape, and unevenness may be formed at a surface thereof which is in contact with the belt 212. Moreover, in an embodiment in which the rotating member 210 includes three or more wheel 213, the collecting unit 200 may further include a removing member 220.

Also preferably, the apparatus for manufacturing SiO according to the present disclosure may further include a supplying unit 300, as shown in FIG. 1.

The supplying unit 300 stores materials required for making SiO and supplies these materials to the reaction unit 100. For example, the supplying unit 300 may store silicon dioxide powder and silicon powder as the SiO-making material and supply them to the inner space of the reaction unit 100. At this time, the supplying unit 300 may mix these material powders at a suitable ratio and supply the mixed powder to the reaction unit 100.

If the apparatus for manufacturing SiO includes the supplying unit 300 as described above, the SiO-making material may be automatically supplied to the reaction unit 100, which allows SiO to be made more continuously and rapidly.

Hereinafter, a method for manufacturing SiO according to the present disclosure will be described.

Figure 17:
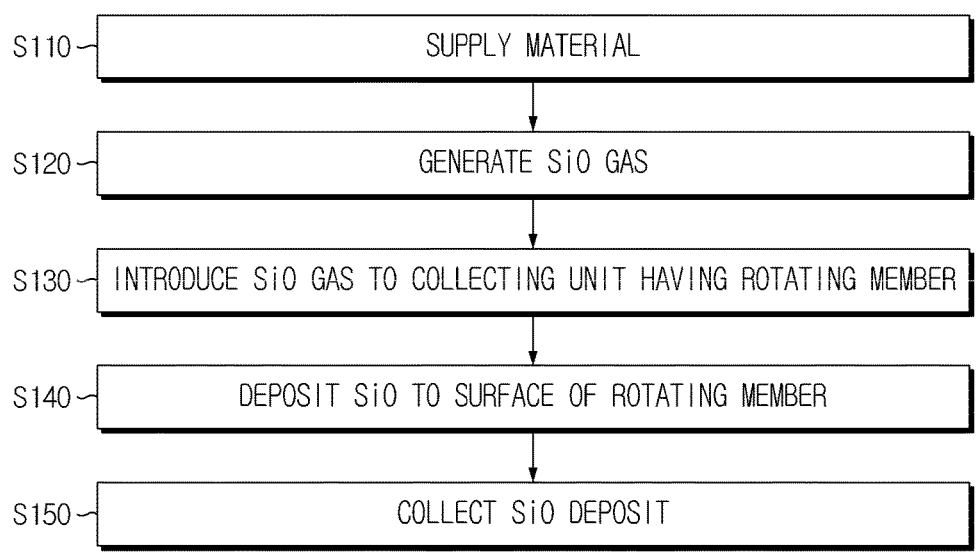
FIG. 17 is a schematic flowchart for illustrating a method for manufacturing SiO according to an embodiment of the present disclosure.

FIG. 17 is a schematic flowchart for illustrating a method for manufacturing SiO according to an embodiment of the present disclosure. In FIG. 17, each operation may be performed by each component of the apparatus for manufacturing SiO, described above.

In the method for manufacturing SiO according to the present disclosure, first, a SiO-making material is supplied to the reaction unit 100 (S110). Here, the SiO-making material supplied to the reaction unit 100 may include silicon dioxide powder and silicon powder, but the present disclosure is not limited to such kinds or forms.

If the SiO-making material is supplied to the reaction unit 100 as described above, the reaction unit 100 heats the supplied material and brings the material into reaction to generate a SiO gas (S120). Here, Step S120 may be performed in a temperature condition of 1200° C. to 1500° C. Next, the generated SiO gas is introduced to the collecting unit 200 (S130). At this time, the collecting unit 200 maintains its internal temperature lower than the internal temperature of the reaction unit 100 and includes the rotating member 210, namely the rotating body 211 rotating based on a central axis, and/or a belt conveyor composed of the belt 212 and the wheel 213, in its inner space.

In the collecting unit 200, the SiO gas is deposited to the surface of the rotating member 210, namely to the surface of the rotating body 211 or the surface of the belt 212, to form a SiO deposit (S140). The SiO deposit formed as above is collected (S150).

Preferably, Step S130 may be performed in operation of the rotating member 210, for example while the rotating body 211 is rotating or the belt 212 is moving by the wheel 213.

Also preferably, in Step S130, the rotating body 211 may have a cylindrical shape and rotate in a circumferential direction.

Also preferably, Step S150 may include a component for separating the SiO deposit from the surface of the rotating body 211 or the belt 212. In this case, the SiO deposit may be separated by bringing at least an edge of the removing member 220 having a plate form into contact with the surface of the rotating body 211 or the belt 212. In other cases, the SiO deposit may also be separated by injecting a gas to the surface of the rotating body 211 or the belt 212.

Also preferably, in Step S150, the SiO deposit may be detached from the surface of the rotating body 211 or the belt 212 by vibrating the rotating member 210.

Also preferably, Step S140 may be performed under a temperature condition where the collecting unit 200 has an internal temperature of 200° C. to 500° C.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

Meanwhile, even though terms representing directions such as upper, lower, right and left are used in the specification, this is just for convenience, and the terms representing directions may be changed depending on a location of an observer or an arrangement of an observed target.

What is claimed is:

1. An apparatus for manufacturing SiO, comprising:
    a reaction unit configured to receive a SiO-making material and bring the received material into reaction by heating to generate a SiO gas; and
    a collecting unit configured to maintain an internal temperature lower than an internal temperature of the reaction unit, the collecting unit including a rotating member in an inner space thereof, wherein the rotating member includes a belt and at least two wheels, and wherein at least one of the wheels has a circular shape and at least one of the wheels has a polygonal shape in a front form thereof, and wherein the at least one wheel having the polygonal shape is disposed at a lower portion of the rotating member than the at least one wheel having the circular shape,
    wherein the collecting unit collects a SiO deposit by introducing the SiO gas generated by the reaction unit through an inlet formed at least at one side thereof and allowing the introduced SiO gas to be deposited to a surface of the rotating member, and
    wherein the collecting unit further includes a removing member for separating the SiO deposit from the surface of the rotating member by injecting a gas to the surface of the rotating member and controls the internal temperature by means of the gas injected by the removing member.

2. The apparatus for manufacturing SiO according to claim 1, wherein the gas introduced through the inlet is deposited to a surface of the belt.

3. The apparatus for manufacturing SiO according to claim 2, wherein the collecting unit rotates the at least two wheels to move the belt while the SiO gas is being introduced.

4. The apparatus for manufacturing SiO according to claim 1, wherein at least one of the wheels has unevenness on a surface thereof which is in contact with the belt.

5. The apparatus for manufacturing SiO according to claim 4, wherein the unevenness is formed in a rotating direction of the wheel.

6. The apparatus for manufacturing SiO according to claim 1, wherein the rotating member includes three or more wheels, and the belt has three or more bent portions.

7. The apparatus for manufacturing SiO according to claim 6, wherein the inlet is formed in an upper portion of the collecting unit, and
    wherein the rotating member is formed so that a length direction of an upper portion of the belt is a horizontal direction.

8. The apparatus for manufacturing SiO according to claim 1, wherein the collecting unit cools the surface of the rotating member by means of the gas injected by the removing member.

* * * * *